United States Patent
Anderson et al.

(10) Patent No.: US 7,782,147 B2
(45) Date of Patent: Aug. 24, 2010

(54) APPARATUS FOR PROVIDING OSCILLATOR FREQUENCY STABILITY

(75) Inventors: Mark V. Anderson, Fort Worth, TX (US); John L. Dascanio, II, Fort Worth, TX (US); Andrew T. Morrison, Euless, TX (US); Dale E. Ray, Fort Worth, TX (US)

(73) Assignee: Motorola, Inc., Schaumburg, IL (US)

( * ) Notice: Subject to any disclaimer, the term of this patent is extended or adjusted under 35 U.S.C. 154(b) by 155 days.

(21) Appl. No.: 11/765,609

(22) Filed: Jun. 20, 2007

(65) Prior Publication Data
US 2008/0315962 A1 Dec. 25, 2008

(51) Int. Cl.
H03B 5/32 (2006.01)
(52) U.S. Cl. .......................... 331/69; 331/158; 331/176
(58) Field of Classification Search .................. 331/66, 331/68, 69, 108 D, 158, 159, 108 C, 70; 310/343–344, 310/314–318
See application file for complete search history.

(56) References Cited

U.S. PATENT DOCUMENTS

| | | | | |
|---|---|---|---|---|
| 5,917,272 A | * | 6/1999 | Clark et al. | 310/343 |
| 6,621,361 B1 | * | 9/2003 | Fry | 331/69 |
| 7,023,291 B2 | * | 4/2006 | Kato et al. | 331/158 |
| 7,071,598 B2 | * | 7/2006 | Satoh | 310/343 |
| 7,088,032 B2 | * | 8/2006 | Oita et al. | 310/343 |
| 7,310,024 B2 | * | 12/2007 | Milliren et al. | 331/69 |
| 7,427,902 B2 | * | 9/2008 | Matsuoka | 331/69 |

OTHER PUBLICATIONS

Karlquist, R.K. et al. A Low-Profile High-Performance Crystal Oscillator for Timekeeping Applications, 1997 IEEE International Frequency Control Symposium, pp. 873-884.

* cited by examiner

*Primary Examiner*—James H. Cho
*Assistant Examiner*—Christopher Lo

(57) ABSTRACT

An apparatus for providing oscillator frequency stability is disclosed. The apparatus includes an internally ovenized oscillator module having an oscillator and an inner heater to maintain the oscillator at a first temperature during operation. The apparatus also includes a thermally conductive cover for forming a first compartment to contain the internally ovenized oscillator module along with multiple heaters. The heaters are in thermal communication with the thermally conductive cover and the substrate to form an oven to keep the internally ovenized oscillator module at a stable second temperature during operation. In addition, the apparatus includes a thermally insulative cover for forming a second compartment to contain the first compartment.

12 Claims, 3 Drawing Sheets

APPARATUS FOR PROVIDING OSCILLATOR FREQUENCY STABILITY

BACKGROUND OF THE INVENTION

1. Technical Field

The present invention relates to oscillators in general, and, in particular, to an ovenized oscillator for generating a reference frequency signal in electronic equipment. Still more particularly, the present invention relates to an apparatus for ensuring ovenized oscillator to generate a stable reference frequency signal.

2. Description of Related Art

Oscillators are generally utilized to provide a reference frequency signal for other electronic components. An oscillator typically has a quartz crystal (or resonator) along with other electronic compensation circuitry to generate a reference frequency output signal. Since the reference frequency output signal from an oscillator may change as the temperature of the oscillator changes, various methods are required to be utilized to stabilize the reference frequency output signal of the oscillator. For example, ovens can be furnished within oscillators to heat certain sensitive circuits that are isolated from the ambient in order to obtain a more stable reference frequency output signal.

Ovenized oscillators usually contain a heater and a temperature sensor along with a temperature controller to control the heater. The temperature controller holds the crystal and other critical circuitry at a constant temperature. A good temperature controller can provide a steady current that changes with the ambient temperature to hold the oven at a precise set-point, usually about 10 degrees above the highest expected ambient temperature. Temperature induced frequency variations can be greatly reduced by an amount approaching the thermal gain of the oven. The crystal for the oven is selected to have a "turning-point" at or near the oven temperature to further reduce its sensitivity to temperature. The combination of the high oven gain with operation near turning point yields frequency stabilities as good as 0.0001 ppm over a temperature range that would otherwise cause the crystal to change by 10 ppm.

The frequency stability of a single ovenized oscillator can be further improved by using two ovens. In a dual-oven configuration, one insulated enclosure is placed inside of another insulated enclosure with a proportionally controlled heater assembly for each. In order to best maintain temperature control of the assembly under varying ambient conditions, it is necessary to maintain a differential of about 10 degrees Celsius between the highest ambient temperature to be experienced and the set point of the outer oven. Another 10 degrees Celsius differential is then required between the set points of the outer oven and the inner oven. Thus, the total temperature rise above ambient between the crystal/resonator and the outside of the outer oven can be more than 20 degrees Celsius.

Although dual-oven oscillators can generate highly stable frequency output signals, they are also very expensive. Consequently, it would be desirable to provide an improved apparatus for providing oscillator frequency stability.

SUMMARY OF THE INVENTION

In accordance with various embodiments of the present invention, an apparatus for providing oscillator frequency stability includes an internally ovenized oscillator module having an oscillator and an inner heater to maintain the oscillator at a first temperature during operation. The apparatus also includes a thermally conductive cover for forming a first compartment to contain the internally ovenized oscillator module along with multiple heaters. The heaters are in thermal communication with the thermally conductive cover in order to keep the internally ovenized oscillator module at a second temperature during operation. In addition, the apparatus includes a thermally insulative cover for forming a second compartment to contain the first compartment.

All features and advantages of embodiments of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF EMBODIMENTS

The turning-point of an oscillator is the temperature at which minimum frequency change occurs when the temperature is varied. In other words, it is the temperature at which a frequency versus temperature characteristic curve of a quartz crystal within the oscillator is mostly flat. Thus, it is desirable to operate the quartz crystal at the turning-point temperature in order to attain the most stable operational frequency. The turning-point is unique to each individual quartz crystal but it generally occurs between 85 EC and 105 EC for SC cut quartz crystals. A quartz crystal should be operated within ∀0.01 EC of the turning-point temperature in order to obtain the desired stability of 0.1 ppb or $1.0\ e^{-10}$. Hence, a temperature controlled oven environment surrounding a quartz crystal is utilized to keep the quartz crystal temperature constant.

Figure 1:
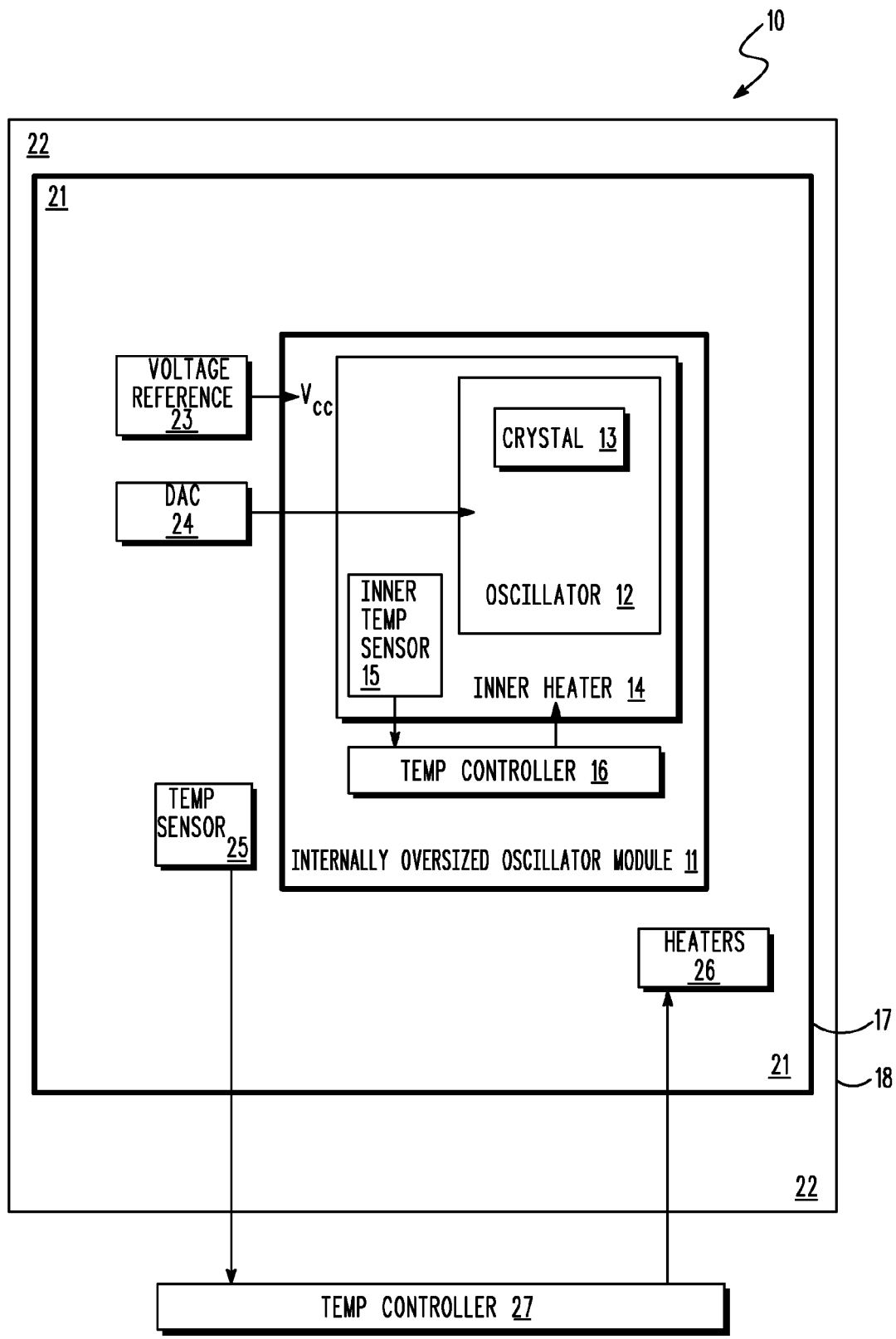
FIG. 1 is a block diagram of an ovenized oscillator in which an embodiment of the present invention is incorporated.

Referring now to the drawings and in particular to FIG. 1, there is depicted a block diagram of an ovenized oscillator in which an embodiment of the present invention is incorporated. As shown, an ovenized oscillator 10 includes a first compartment 21 and a second compartment 22 surrounding first compartment 21. First compartment 21 is formed by a thermally conductive cover 17 over a substrate, and second compartment 22 is formed by a thermally insulative cover 18 over the same substrate. Thermally conductive cover 17 is made of metal, and thermally insulative cover 18 is made of non-metal. Preferably, thermally conductive cover 17 is made of copper, and thermally insulative cover 18 is made of plastic.

First compartment 21 contains an internally ovenized oscillator module 11, a voltage reference module 23, a digital-to-analog converter (DAC) 24, a temperature sensor 25 and multiple heaters 26.

Internally ovenized oscillator module 11 includes an oscillator 12 having a crystal (or resonator) 13 heated by an inner heater 14. Internally ovenized oscillator module 11 also includes a temperature controller 16 for controlling the temperature of inner heater 14 according to the information provided by an inner temperature sensor 15 located within inner heater 14. Oscillator 12 is electrically connected to crystal 13 that provides a stable frequency signal for oscillator 12.

Voltage reference module 23 provides a stable input voltage for powering internally ovenized oscillator module 11. Along with voltage reference module 23, DAC 24 provides appropriate voltage signals to allow precise voltage control on oscillator 12.

Heaters 26 are preferably surface-mounted resistors. During operation, heaters 26, which work in conjunction with temperature sensor 25 and a temperature controller 27, provide an appropriate amount of heat within first compartment 21 such that the air temperature within first compartment 21 is relatively constant with respect to ambient temperature. As a result, internally ovenized oscillator module 11 is less affected by any change in the ambient temperature, and the stability of the reference frequency output signal from oscillator 12 is maintained independent of the ambient temperature.

Figure 2:
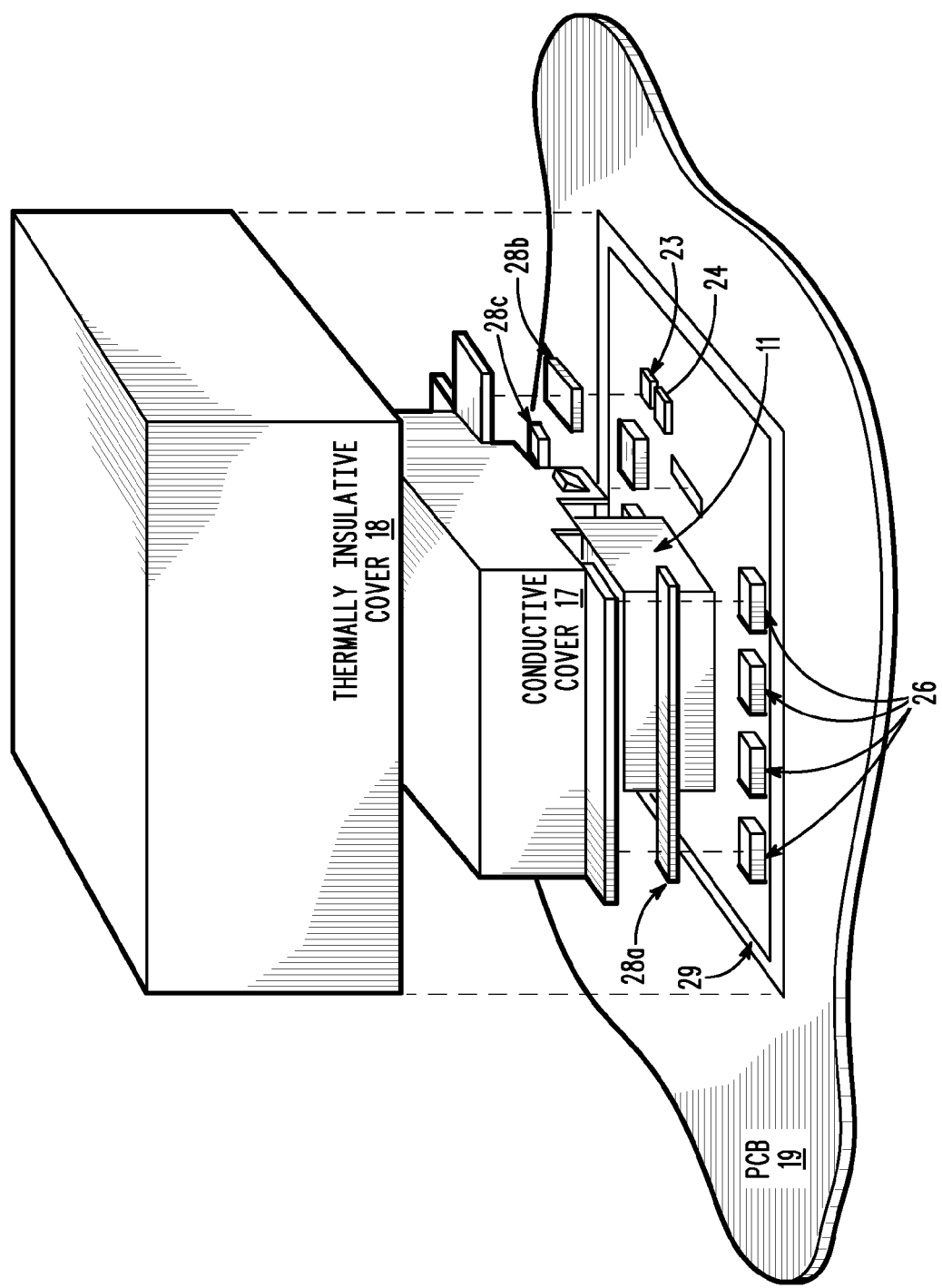
FIG. 2 is an isometric view of the ovenized oscillator from FIG. 1, in accordance with an embodiment of the present invention.
Figure 3:
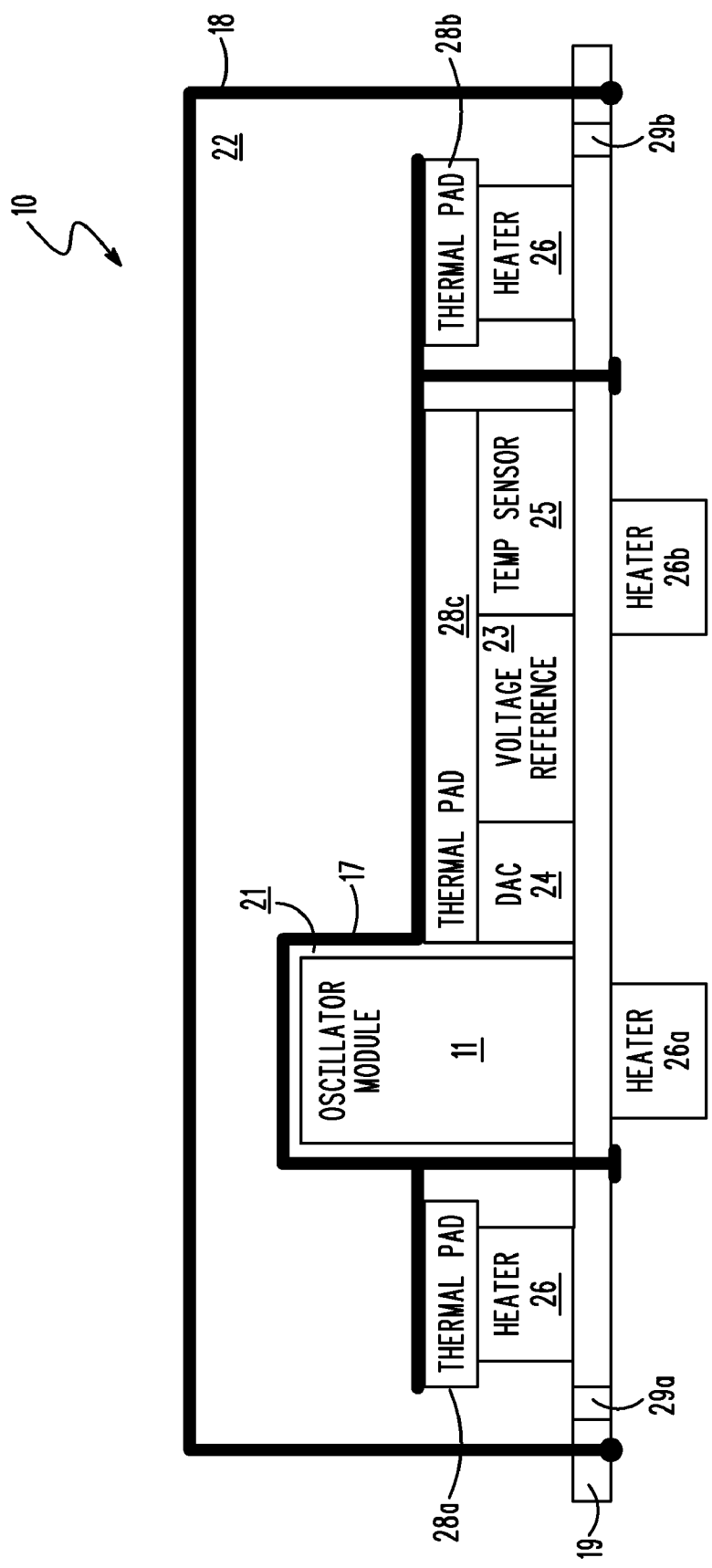
FIG. 3 is a cross-sectional view of the ovenized oscillator from FIG. 1, in accordance with an embodiment of the present invention.

With reference now to FIGS. 2-3, there are illustrated an isomeric view and a cross-sectional view of ovenized oscillator 10 from FIG. 1, in accordance with an embodiment of the present invention. As shown, thermally conductive cover 17 can be mounted on a substrate 19 to form first compartment 21, and thermally insulative cover 18 can be mounted on substrate 19 to form second compartment 22 surrounding first compartment 21. Preferably, thermally conductive cover 17 and thermally insulative cover 18 can be snapped on to substrate 19 without any sealing. Thermally conductive cover 17 includes thermal pads 28a-28c.

As mentioned above, thermally conductive cover 17 is preferably made of copper, and thermally insulative cover 18 is preferably made of plastic. Substrate 19 can be a printed circuit board or a ceramic substrate patterned with circuit lines. In addition, substrate 19 may include at least one thermal break 29 near edges of thermally insulative cover 18 for further facilitating insulative effectiveness. Thermal break 29 can be formed by a gap, a channel or a groove formed on the surface or inside of substrate 19.

Internally ovenized oscillator module 11 along with voltage reference module 23, DAC 24 and temperature sensor 25 are all mounted on substrate 19. Heaters 26c-26g, which are mounted on substrate 19, are shown to locate between thermally conductive cover 17 and thermally insulative cover 18 to provide an appropriate amount of heat to first compartment 21 via the sidewalls of thermally conductive cover 17. Heaters 26a-26b, which are mounted on the different surface of substrate 19 from other active components, are shown to locate underneath temperature sensor 25 and internally ovenized oscillator module 11 to provide an appropriate amount of heat to first compartment 21 via the substrate 19.

Oscillator 12 within internally ovenized oscillator module 11 is kept at approximately a first temperature during operation. Heaters 26 and 26a-26b are in thermal communication with internally ovenized oscillator module 11 in order to keep internally ovenized oscillator module 11 at approximately a second temperature during operation. Specifically, each of heaters 26 is in thermal contact with thermally conductive cover 17 via one of thermal pads 28a-28c.

As has been described, various embodiments of the present invention provide an improved apparatus for providing oscillator frequency stability. With various embodiments of the present invention, instead of a full ambient temperature variation of, for example, −40 EC to +85 EC, the temperature variation surrounding an internally ovenized oscillator module can only be within ∀5 EC. As a result, the temperature range of a crystal within the oscillator is kept within the desired temperature range of ∀0.01 EC.

While the invention has been particularly shown and described with reference to embodiments, it will be understood by those skilled in the art that various changes in form and detail may be made therein without departing from the spirit and scope of the invention.

What is claimed is:

1. An apparatus for providing oscillator frequency stability, said apparatus comprising:
    a single substrate;
    an internally ovenized oscillator module having an oscillator and an inner heater for maintaining said oscillator at approximately a first temperature during operation;
    a thermally conductive cover mounted on said single substrate for forming a first compartment to contain said internally ovenized oscillator module and a plurality of heaters, wherein said plurality of heaters are in thermal communication with said thermally conductive cover in order to keep said internally ovenized oscillator module at approximately a second temperature during operation; and
    a thermally insulative cover mounted on said single substrate for forming a second compartment to contain said first compartment.

2. The apparatus of claim 1, wherein said first compartment further includes
    a voltage reference module for providing a stable voltage input to said internally ovenized oscillator module; and
    a digital-to-analog converter for providing a precise voltage input to said oscillator within said internally ovenized oscillator module.

3. The apparatus of claim 1, wherein said second compartment further includes a plurality of secondary heaters mounted on said single substrate.

4. The apparatus of claim 1, wherein said plurality of heaters are in thermal contact with said internally ovenized oscillator module via said single substrate.

5. The apparatus of claim 1, wherein said plurality of secondary heaters are in thermal contact with said internally ovenized oscillator module via sidewalls of said thermally conductive cover.

6. The apparatus of claim 1, wherein each of said plurality of secondary heaters are in thermal contact with said thermally conductive cover via a respective thermal pad.

7. The apparatus of claim 1, wherein said plurality of heaters are surface-mounted resistors.

8. The apparatus of claim 1, wherein said thermally conductive cover is made of metal.

9. The apparatus of claim 1, wherein said thermally conductive cover is made of copper.

10. The apparatus of claim 1, wherein said thermally insulative cover is made of non-metal.

11. The apparatus of claim 1, wherein said thermally insulative cover is made of plastic.

12. The apparatus of claim 1, wherein said single substrate includes a plurality of thermal breaks.

* * * * *